United States Patent
Huang et al.

(10) Patent No.: US 11,489,454 B2
(45) Date of Patent: Nov. 1, 2022

(54) METHOD FOR CALCULATING MAXIMUM OUTPUT CURRENT OF MULTIPLE THYRISTOR CONVERTERS CONNECTED IN PARALLEL

(71) Applicant: Hefei Institutes of Physical Science, Chinese Academy of Sciences, Anhui (CN)

(72) Inventors: Liansheng Huang, Anhui (CN); Zhongma Wang, Anhui (CN); Peng Fu, Anhui (CN); Shiying He, Anhui (CN); Xiaojiao Chen, Anhui (CN); Xiuqing Zhang, Anhui (CN); Tianbai Deng, Anhui (CN); Tao Chen, Anhui (CN); Zhenshang Wang, Anhui (CN)

(73) Assignee: HEFEI INSTITUTES OF PHYSICAL SCIENCE, CHINESE ACADEMY OF SCIENCE, Anhui (CN)

( * ) Notice: Subject to any disclaimer, the term of this patent is extended or adjusted under 35 U.S.C. 154(b) by 0 days.

(21) Appl. No.: 17/342,522

(22) Filed: Jun. 8, 2021

(65) Prior Publication Data
US 2022/0060106 A1    Feb. 24, 2022

(30) Foreign Application Priority Data
Aug. 21, 2020    (CN) .......................... 202010851619.9

(51) Int. Cl.
H02M 7/17    (2006.01)
H02M 1/00    (2006.01)
(Continued)

(52) U.S. Cl.
CPC .............. H02M 7/17 (2013.01); G01R 19/04 (2013.01); H02M 1/0009 (2021.05); H02M 7/162 (2013.01)

(58) Field of Classification Search
CPC .... H02M 1/0012; H02M 7/145; H02M 7/153; H02M 7/17; H02M 1/0009; H02M 7/162
See application file for complete search history.

(56) References Cited

U.S. PATENT DOCUMENTS 10,141,854 B1 * 11/2018 Butler ............... H02M 3/33569
2014/0214343 A1 * 7/2014 Bengtsson ............ H02M 7/066
702/58
(Continued)

*Primary Examiner* — Alex Torres-Rivera
(74) *Attorney, Agent, or Firm* — Moazzam & Associates, LLC

(57) ABSTRACT

A method for calculating a maximum output current of multiple thyristor converters connected in parallel, step 1: setting an operating time t; step 2: assuming a trigger angle; step 3: calculating a maximum output current of a single converter according to an output current model for the single converter; step 4: equally dividing a total output DC current into a plurality of parts according to a working duration of six converter bridge arms, thereby obtaining a pulse operating current of a single bridge arm; step 5: checking whether a present junction temperature of a thyristor is below a limiting temperature based on a thermal resistance model for the thyristor, if no, correcting the trigger angle, and repeating step 2 to step 5 until the condition is met; step 6: giving a present trigger angle; and step 7: giving a maximum output current of multiple converters connected in parallel.

7 Claims, 4 Drawing Sheets

(51) Int. Cl.
*G01R 19/04* (2006.01)
*H02M 7/162* (2006.01)

(56) References Cited

U.S. PATENT DOCUMENTS

2017/0027025 A1* 1/2017 Kanai ................ H05B 6/08
2019/0319523 A1* 10/2019 Jin .................... H02K 23/36
2020/0044576 A1* 2/2020 Besselmann ........ H02M 5/4505

* cited by examiner

METHOD FOR CALCULATING MAXIMUM OUTPUT CURRENT OF MULTIPLE THYRISTOR CONVERTERS CONNECTED IN PARALLEL

This patent application claims priority to Chinese Patent Application Serial Number 202010851619.9, filed on Aug. 21, 2020; the content of which is hereby incorporated by reference herein in its entirety into this disclosure.

TECHNICAL FIELD

The present disclosure relates to the field of high power converter systems, and is mainly applied to calculation of a maximum short-time high current of multiple thyristor converters connected in parallel so as to meet shock requirements for type tests on equipment such as high power switches.

BACKGROUND

With the upgrading of the electric power industry, an increasing number of large-scale power equipments have been put into use. In order to verify the operational reliability of power equipment under severe working conditions, short-time pulse shock tests of tens of kA to hundreds of kA are required. Such a short-time pulse shock test can be supported by existing thyristor converters capable of providing an instantaneous high current while satisfying a rated output, without constructing an instantaneous current shock platform. There is a need to provide a method for measuring an output current of multiple thyristor converters connected in parallel to reduce the system simulation and design time of a converter and provide reliable and rapid guidance for actual shock tests.

SUMMARY

An objective of the present disclosure is to calculate a maximum output current of multiple converters connected in parallel based on the short-time multi-fold overload withstanding characteristic of a high power thyristor converter, to meet the need of a high current shock test on large-scale power equipment. Short-time transient high current pulses are provided while steady-state output of a rated current is satisfied. A high current that multiple converters connected in parallel can withstand is calculated by using an equivalent impedance model for a converter system and a thyristor junction temperature model.

The technical solution of the present disclosure is as follows: a method for calculating a maximum output current of multiple thyristor converters connected in parallel includes the following steps:

step 1: setting an operating time t and determining a time for outputting a long pulse current according to an actual demand;

step 2: assuming a trigger angle for subsequent output current calculation;

step 3: calculating a maximum output current of a single converter according to an output current model for the single converter;

step 4: equally dividing a total output DC current into a plurality of parts according to a working duration of six converter bridge arms, thereby obtaining a pulse operating current of a single bridge arm;

step 5: checking whether a present junction temperature of a thyristor is below a limiting temperature using a current waveform obtained in step 4 based on a thermal resistance model for the thyristor, if no, correcting the trigger angle, and repeating step 2 to step 5 until the condition is met;

step 6: giving a present trigger angle to provide guidance for actual experimental operations;

and step 7: giving a maximum output current of multiple converters connected in parallel based on the maximum output current of the single converter in combination with a current-sharing coefficient for converters.

Further, the method includes establishing an equivalent impedance model by using a multiple parallel-connected converter system to obtain a calculation formula for the maximum output current of multiple converters connected in parallel. The model may be established as follows:

the converter system is divided into an alternating current (AC) side and a direct current (DC) side; on the AC side, the grid side is connected to step-down transformers through high voltage buses, and the step-down transformers are connected to rectifier transformers that are connected to input ends of converters through AC buses; and on the DC side, output ends of the converters are connected to DC reactors for balancing current through DC buses and finally connected to a load. The number of step-down transformers may be assumed as M, with each step-down transformer being connected with N converter branches and each branch including the rectifier transformer, the AC bus, the converter, the DC reactor, the DC bus and the load. Since a plurality of branches are connected in parallel, currents of all branches may be input together to the load by a DC busbar.

Further, the method includes implementing a system impedance connection based on a relationship between an output voltage and an input voltage of a thyristor converter.

Further, the method includes enabling AC side parameters to be equivalent to those of a secondary side of the rectifier transformer based on parameters of the converter system.

Further, the method includes checking a maximum withstand current of a single converter by using the thermal resistance model for the thyristor, and multiplying the maximum withstand current by the number of the converters connected in parallel and the current-sharing coefficient to obtain an actual maximum output current of the multiple converters connected in parallel.

Further, the method includes performing iteration to determine a trigger angle at the maximum withstand current of the single converter.

Further, the limiting temperature may be 125° C.

Beneficial Effects:

Compared with the prior art, the present disclosure has the following advantages: for maximum output currents, high pulse currents are mostly realized by means of capacitor or flywheel discharge at present. A high power thyristor converter is capable of realizing steady-state output of a current of tens of kA. Besides, a thyristor converter is capable of withstanding several times of a rated operating current in a short time. A plurality of converters can be connected in parallel to realize short-time high current output to meet the needs of most of situations in the power industry. The present disclosure provides a method for calculating a maximum output current of a plurality of converters, which can meet the requirements of improving the application functions of the converters and reducing the manufacturing cost of a pulse forming platform.

DETAILED DESCRIPTION

The technical solutions in embodiments of the present disclosure will be described clearly and completely with reference to the accompanying drawings in the embodiments of the present disclosure. Apparently, the described embodiments are merely a part rather than all of the embodiments of the present disclosure. All other embodiments derived from the embodiments of the present disclosure by a person of ordinary skill in the art without creative efforts shall fall within the protection scope of the present disclosure.

Figure 1:
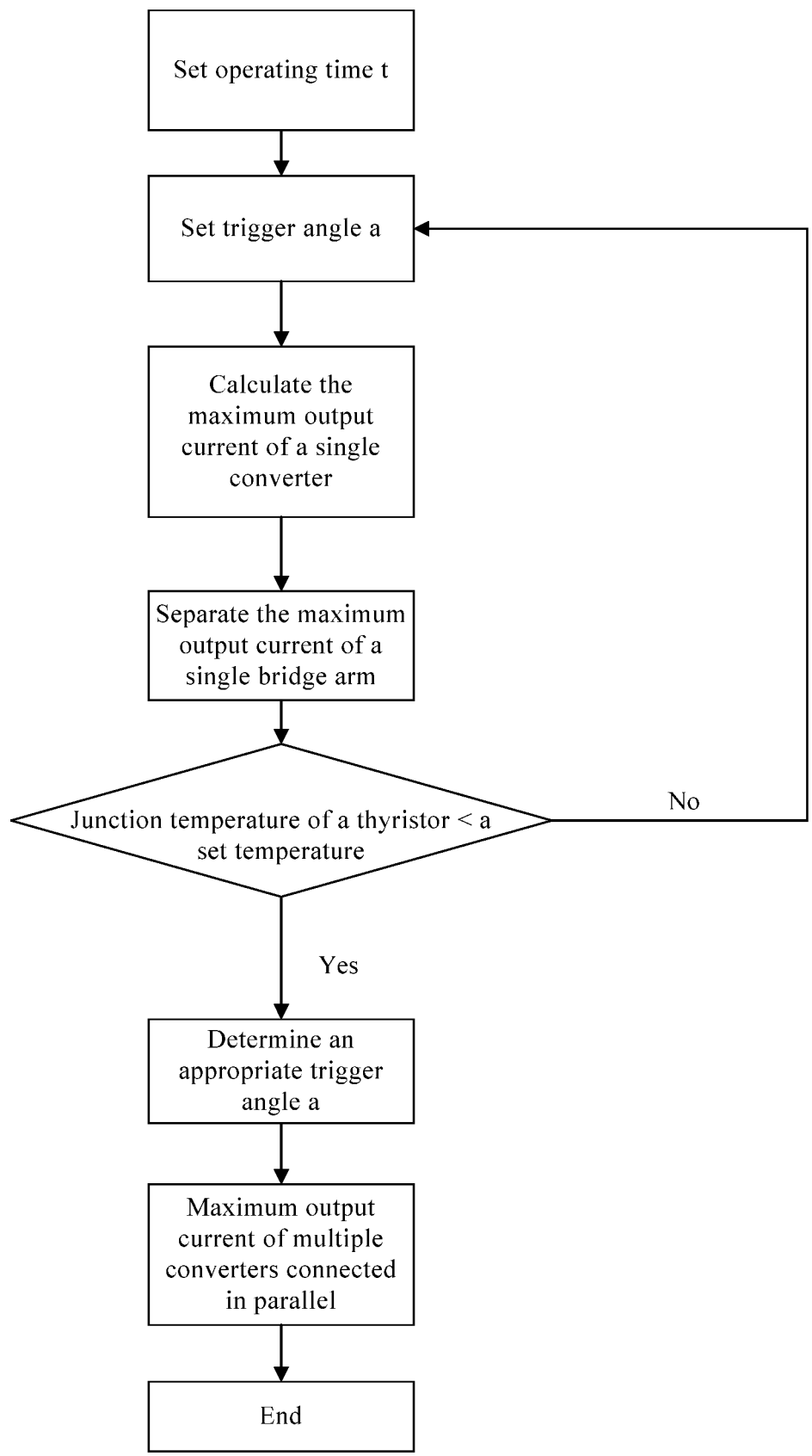
FIG. 1 is a flowchart of calculation of power and temperature of a converter system according to an embodiment of the present disclosure.

According to one embodiment of the present disclosure, a method for calculating a maximum output current of multiple thyristor converters connected in parallel is provided. An equivalent impedance model may be built based on parameters of a power grid, a high voltage AC bus, a step-down transformer, a rectifier transformer, a rectifier, a reactor and a DC bus that are included in a multiple parallel-connected converter system, and a theoretical calculated value of a maximum output current of a single converter can be obtained from a relationship between a DC side output current and an AC side output voltage of a thyristor converter. With a thermal resistance model for a thyristor, an actual withstand current of a single converter is checked and a thyristor trigger angle is obtained in limited operating time. An actual withstand current of multiple thyristor converters connected in parallel is given with the consideration of a current-sharing coefficient for multiple converters connected in parallel. The specific calculation process, as shown in FIG. 1, includes the following steps:

step 1: set an operating time t and determine a time for outputting a long pulse current according to an actual demand;

step 2: assume a trigger angle for subsequent output current calculation;

step 3: calculate a maximum output current of a single converter according to an output current model for the single converter;

step 4: equally divide a total output DC current into six parts according to a working duration of six converter bridge arms, thereby obtaining a pulse operating current of a single bridge arm;

step 5: check whether a present junction temperature of a thyristor is below 125° C. using a current waveform obtained in step 4 based on a thermal resistance model for the thyristor, if no, correct the trigger angle, and repeat step 2 to step 5 until the condition is met;

step 6: give a present trigger angle to provide guidance for actual experimental operations; and step 7: give a maximum output current of multiple converters connected in parallel based on the maximum output current of the single converter in combination with the current-sharing coefficient (typically 0.8-0.9) for converters.

The overall calculation can be achieved using MATLAB programming according to the flowchart of FIG. 1. The difficulty of the method is how to obtain the output current of the single converter. To solve this technical problem, an equivalent model is built based on a converter system and a calculation formula is derived. The specific steps are as follows:

Step 1: Setting of time t

The operating time t of a converter is determined according to the need of an experiment. In MATLAB, the time is set to 0 and a time interval is set to t.

Step 2: Setting of a trigger angle

The trigger angle is selected from a minimum angle according to an operating range of the converter. The trigger angle is typically 20° to 90°.

Step 3: Calculation of the maximum output current of the converter

Generally, a plurality of step-down transformers may be connected to a power grid, and one step-down transformer may be connected with a plurality of rectifier transformers, with each rectifier transformer being matched with one converter and a subsequent output device. After that, series-parallel connection control is carried out on the DC side to output required current and voltage parameters. For the convenience of calculation, the resistance of the AC side, which is very little, is ignored. The equivalent impedance of the converter system may be calculated from the grid side. Specific impedance distribution is as shown in FIG. 2.

The converter system is divided into the AC side and the DC side. On the AC side, the grid side is connected to step-down transformers through high voltage buses, and the step-down transformers are connected to rectifier transformers that are connected to input ends of converters through AC buses. On the DC side, output ends of the converters are connected to DC reactors for balancing current through DC buses and finally connected to a load. In FIG. 2, the number of the step-down transformers is assumed as M, with each step-down transformer being connected with N converter branches and each branch including the rectifier transformer, the AC bus, the converter, the DC reactor, the DC bus and the load. Since a plurality of branches are connected in parallel, currents of all branches will be input together to the load by a DC busbar. The DC bus of each branch and the overall DC busbar are made of the same electrically conductive metal material. In practice, the overall electrical parameters of the buses on the DC side can be directly estimated for the sake of simplicity.

Figure 2:
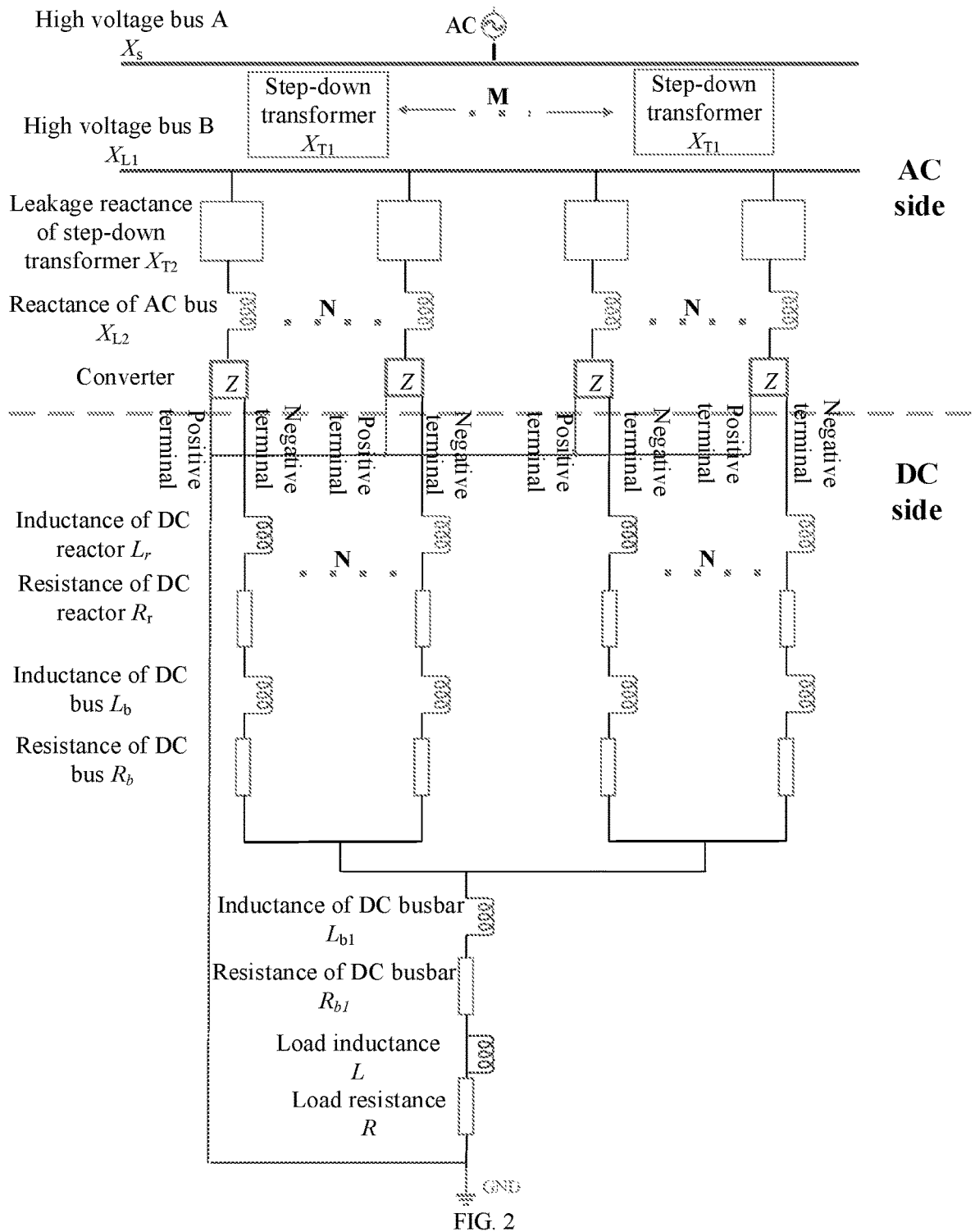
FIG. 2 is a schematic diagram of overall impedance of a power supply system according to an embodiment of the present disclosure.

Physical meanings of specific symbols in FIG. 2 are as shown in table 1.

TABLE 1

Physical Meaning of Different Parts of Power Supply System

| Symbol | Meaning |
|---|---|
| $X_S$ | Leakage reactance of power grid |
| $X_{T1}$ | Leakage reactance of step-down transformer |
| $X_{T2}$ | Leakage reactance of rectifier transformer |
| $X_{L2}$ | Reactance of AC bus |
| $R_r$ | Resistance of DC reactor |
| $L_r$ | Inductance of DC reactor |
| $L_b$ | DC bus inductance for single converter |
| $R_b$ | DC bus resistance for single converter |
| $L_{b1}$ | DC busbar inductance for multiple converters connected in parallel |

TABLE 1-continued

Physical Meaning of Different Parts of Power Supply System

| Symbol | Meaning |
|---|---|
| $R_{b1}$ | DC busbar resistance for multiple converters connected in parallel |
| R | Load resistance |
| L | Load inductance |

Figure 3:
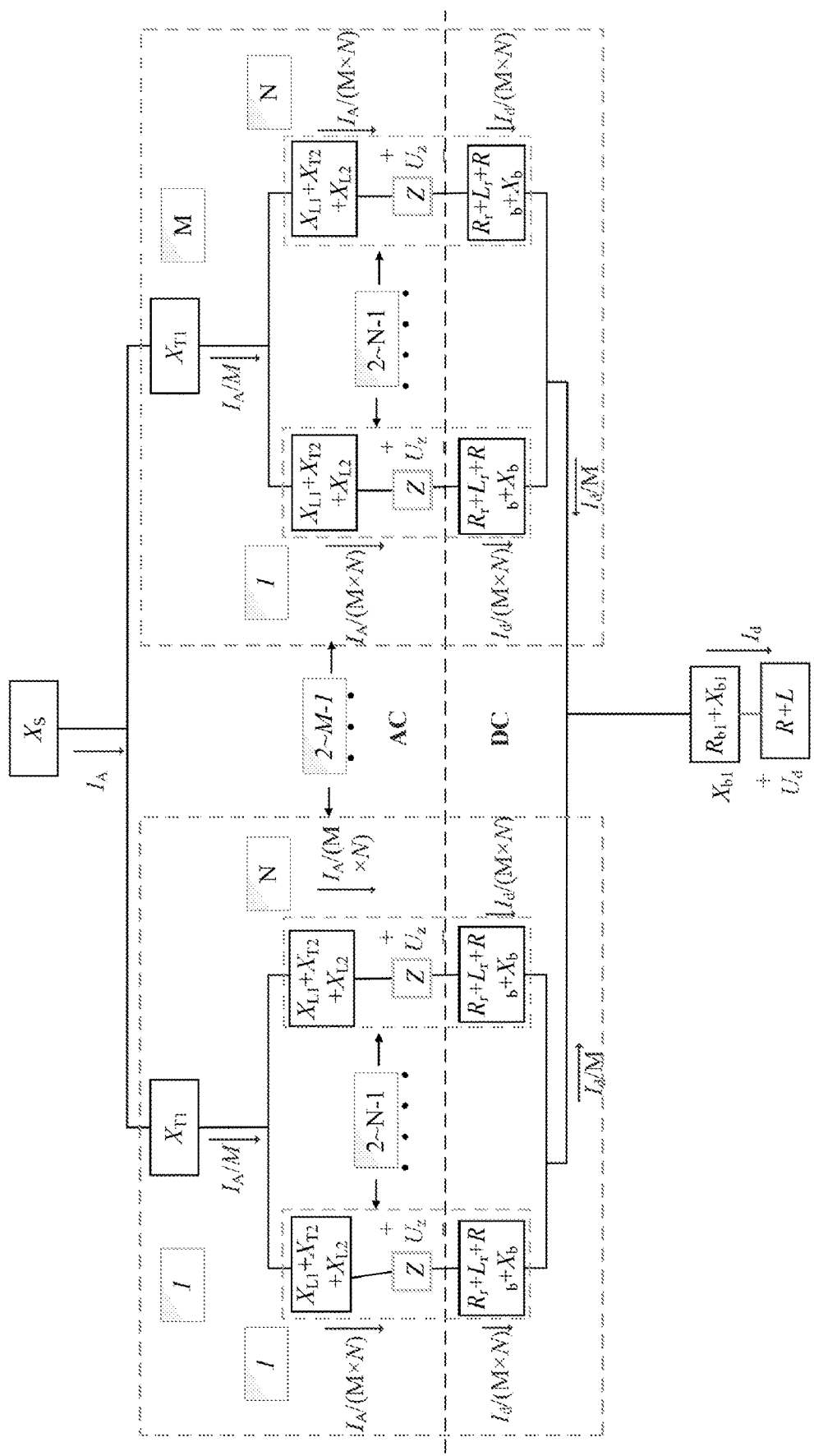
FIG. 3 is a diagram of an impedance circuit of multiple converters connected in parallel according to an embodiment of the present disclosure.

Specific parameters can be substituted into the equivalent impedance model for the converter system to obtain an impedance and current distribution diagram as shown in FIG. 3.

In FIG. 3, different devices in FIG. 2 are expressed by respective resistance or inductance parameters. AC side parameters are equivalent parameters of actual parameters of respective devices on a secondary side of the rectifier transformer, so that a thyristor converter model can be utilized. The AC side and DC side parameters of the same branch are combined, respectively, and current components of all branches at different M and different N. Thus, a diagram of an impedance circuit of multiple converters connected in parallel over one power grid can be obtained.

Figure 4:
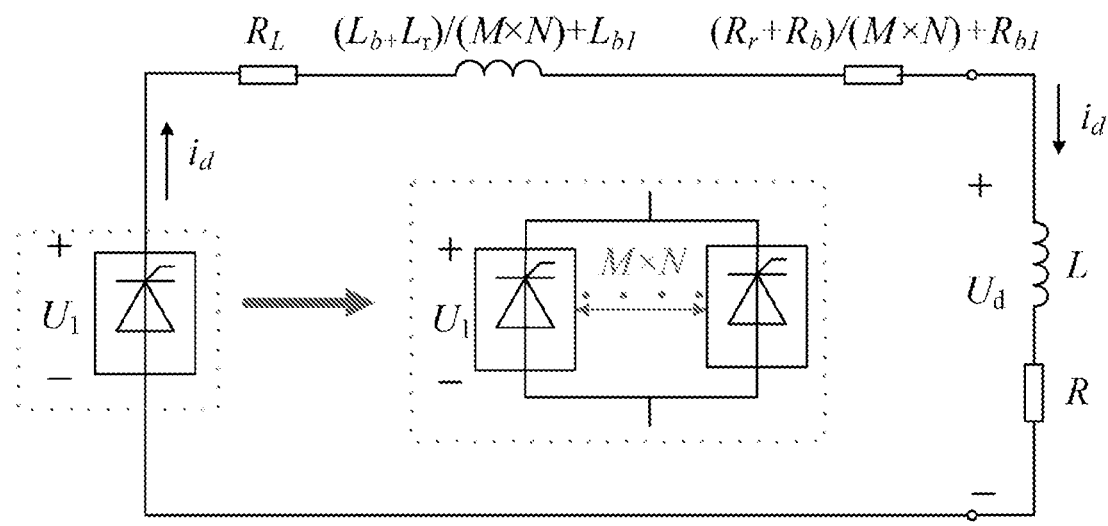
FIG. 4 is a diagram of a rectifying equivalent circuit of converters according to an embodiment of the present disclosure.

According to theories of power electronics, an equivalent converter model is as shown in FIG. 4.

In the figure, $R_L$ represents equivalent internal resistance of the converter system, which is equivalent resistance on the secondary side of the rectifier transformer converted from the AC side reactance of the converter system. $R_L$ can be simplistically expressed as formula (1) by AC side impedance superposition, with specific parameters given below.

$$R_L = X_S + \frac{X_{T1}}{M} + \frac{X_{L1} + X_{T2} + X_{L2}}{M \times N} \tag{1}$$

where M is the number of the step-down transformers in a power system, and N is the number of the converters in a branch.

The circuit as shown in FIG. 4 is calculated as follows according to Kirchhoff's law:

$$U_1 - R_L i_d - \left(\frac{L_b + L_r}{M \times N} + L_{b1}\right)\frac{di_d}{dt} - \left(\frac{R_r + R_b}{M \times N} + R_{b1}\right)i_d = R i_d + L \frac{di_d}{dt} \tag{2}$$

where $U_1$ is a DC side voltage; $i_d$ is an output current; the converter has a DC side output voltage $U_1$ and an AC side input voltage $U_2$ ($U_2$ is a secondary side voltage of the rectifier transformer, i.e., an input voltage to the converter); and Ud is a DC side load voltage. $U_1$ and $U_2$ have a relationship as shown below:

$$U_1 = 1.35 U_2 \cos \alpha_1 \tag{3}$$

where $\alpha_1$ is a trigger angle of the rectifier.

Therefore, the output current can be obtained as below:

$$i_d = \frac{1.35 U_2 \cos\alpha_1}{R_L + \frac{R_r + R_b}{M \times N} + R_{b1} + R}(1 - e^{\frac{-t}{\tau}}). \tag{4}$$

where $$\tau = \frac{\frac{L_b + L_r}{M \times N} + L_{b1} + L}{R_L + \frac{R_r + R_b}{M \times N} + R_{b1} + R} \tag{5}$$

Formula (5) presents merely a relationship between the maximum output current of the converter system and the equivalent impedance of each device. $R_L$ includes converted equivalent reactance values of the AC side power grid, the high voltage buses (cables), the step-down transformers, the AC buses and the rectifier transformers, and the specific conversion process is as follows:

The reduction of the reactance of the power grid system to the secondary side of the rectifier transformer (the voltage is expressed as $U_{2Nz}$) gives:

$$X_{s(U_{2Nz})} = \frac{U_N^2}{S} \frac{U_{2Nz}^2}{U_N^2} = \frac{U_{2Nz}^2}{S} \tag{6}$$

where $U_N$ represents the voltage of the power grid, and S represents the capacity of the power grid.

The reduction of the leakage reactance of the step-down transformer to the secondary side of the rectifier transformer gives:

$$X_{T1(U_{2Nz})} = S_{T1} \frac{U_{2Nz}^2}{S_{Nj}} \tag{7}$$

where $S_{T1}$ represents short-circuit impedance of the step-down transformer (generally expressed in percentage); and $S_{Nj}$ represents the capacity of the step-down transformer.

The reduction of the reactance of the high voltage cable to the secondary side of the rectifier transformer gives:

$$X_{L1(U_{2Nz})} = X_{L1} \cdot \frac{U_{2Nz}^2}{U_{Nz}^2} \tag{8}$$

where $X_{L1}$ represents an actual value of the reactance of the high voltage cable; and $U_{Nz}$ represents the voltage of the high voltage bus.

The leakage reactance of the rectifier transformer is as follows:

$$X_{T2(U_{2Nz})} = S_{T2} \frac{U_{2Nz}^2}{S_{Nz}} \tag{9}$$

where $S_{T2}$ represents short-circuit impedance of the rectifier transformer (generally expressed in percentage); and $S_{NZ}$ represents the capacity of the step-down transformer.

The impedance of the AC busbar between the rectifier transformer and the rectifier is as follows:

$$X_{L2} = 2\pi f L_2 \tag{10}$$

where $L_2$ is the inductance value of the bus; and f is the operating frequency of the converter, which is generally 50 Hz.

The specific parameters of the DC reactor are given by the designer or the manufacturer.

A water-cooled metal bus is used on the DC side of the converter. According to design requirements, the current-carrying section and length of each part of DC bus of the rectifier can be obtained. The formula of the resistivity of the electrically conductive metal bus at different temperatures is as follows:

$$\rho_{m(10°\ C.)} = \rho_{m(10°\ C.)}(1 + \Delta T \alpha_m) \tag{11}$$

In the formula, $\rho_{m(10°\ C.)}$ is the resistivity of the metal bus at 10° C.; $\Delta T$ is a difference between an actual temperature and 10° C.; and $\alpha_m$ is a temperature coefficient of resistivity.

The resistance of the metal busbar is as follows:

$$R_{busbar} = \rho_{m(T°\ C.)} l / S \tag{12}$$

where l is the length of the busbar; and S is the sectional area of the busbar. Thus, $R_b$ and $R_{b1}$ can be calculated.

The DC side bus in the converter can be equivalent to:

$$\frac{R_b}{M \times N} + R_{b1} = \frac{\rho_{m(Tb°C)} \frac{l_b}{S_b}}{M \times N} + \rho_{m(Tb1°C)} \frac{l_{b1}}{S_{b1}} \tag{13}$$

In the formula, the subscripts b and b1 represent corresponding parameters of the DC bus of a single converter and the overall busbar.

The resistance and inductance parameters of the load can be given by the manufacturer, which may not be considered in the calculation of the maximum output capacity of the converters.

The formulas (6) to (12) are substituted into the formula (1) to obtain the equivalent internal resistance of the converters:

$$R_{L(U_{2Nz})} = \frac{U_{2Nz}^2}{S} + \frac{S_{T1} \frac{U_{2Nz}^2}{S_{Nj}}}{M} + \frac{X_{L1} \cdot \frac{U_{2Nz}^2}{U_{Nz}^2} + S_{T2} \frac{U_{2Nz}^2}{S_{Nz}} + 2\pi f L_2}{M \times N} \tag{14}$$

$$\begin{cases} i_{d(U_{2Nz})} = \frac{1.35 U_2 \cos\alpha_1}{R_L + \frac{R_r}{M \times N} + R_{bus} + R}(1 - e^{\frac{-t}{\tau(U_{2Nz})}}) \\ \tau_{(U_{2Nz})} = \frac{\frac{L_b + L_r}{M \times N} + L_{b1} + L}{R_L + \frac{R_r}{M \times N} + R_{bus} + R} \\ R_{L(U_{2Nz})} = \frac{U_{2Nz}^2}{S} + \frac{S_{T1} \frac{U_{2Nz}^2}{S_{Nj}}}{M} + \frac{X_{L1} \cdot \frac{U_{2Nz}^2}{U_{Nz}^2} + S_{T2} \frac{U_{2Nz}^2}{S_{Nz}} + 2\pi f L_2}{M \times N} \\ R_{bus} = \frac{\rho_{m(Tb°C)} \frac{l_b}{S_b}}{M \times N} + \rho_{m(Tb1°C)} \frac{l_{b1}}{S_{b1}} \end{cases} \tag{15}$$

A maximum output current under limited conditions can be obtained based on formula (15), and an operating current of a single bridge arm can be separated using this formula for subsequent thyristor junction temperature correction.

Step 4: Separation of current of bridge arm

The parameters of the converter system are substituted into the calculation formula (15) to obtain the maximum DC output current of the single converter, and the current of a bridge arm is separated in MATLAB according to ⅓ operating time of the bridge arm in one cycle (20 ms) in combination with the six-pulse characteristic of the converter. Let the current during non-operating time be 0, an operating current waveform for a single bridge arm is obtained.

Step 5: Check of thyristor junction temperature

Figure 5:
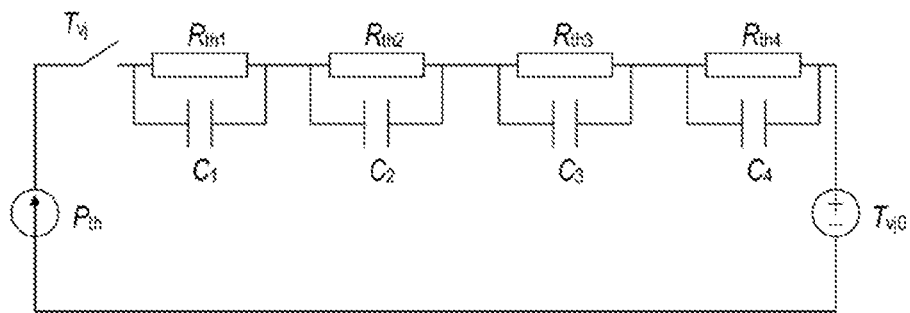
FIG. 5 is a diagram of a transient thermal resistance model for a thyristor according to an embodiment of the present disclosure.

A junction temperature in a fault state is calculated based on the calculated maximum output current of the bridge arm using a transient thermal resistance model for a thyristor as shown in FIG. 5, where $R_{th}$ is the thermal resistance of the thyristor; $T_{vj0}$ is an environmental temperature; and $P_{th}$ is the transient power of the thyristor.

The following formula can be derived from the fourth-order equivalent circuit shown in FIG. 5:

$$Z_{thJC}(t) = R_{th1}(1 - e^{-t/\tau_1}) + R_{th2}(1 - e^{-t/\tau_2}) + R_{th3}(1 - e^{-t/\tau_3}) + R_{th4}(1 - e^{-t/\tau_4}) \tag{16}$$

In an RC parallel circuit, a time constant $\tau = RC$.

in case of breakover overcurrent of the thyristor in a short time, transient power loss $P_{th}$ may be expressed as:

$$P_{th} = V_T i_T = [A + B \cdot i_T + C \cdot \ln(i_T + 1) + D \cdot \sqrt{i_T}] \cdot i_T \tag{17}$$

where $i_T$ is a transient current flowing through the thyristor; A, B, C and D are special parameters and can be obtained from the thyristor data book.

Step 6: Determination of trigger angle

A converter circuit model is built using the thermal resistance model for the thyristor, where $P_{th}$ is input as a controllable current source; and the junction temperature of the thyristor under transient pulses can be obtained by measuring an overall circuit voltage. A maximum output current in accordance with the time and the junction temperature can be obtained by scanning of parameters according to a trigger junction temperature limiting condition. A trigger angle satisfying the condition is given to provide reference for actual experimental operations.

Step 7: Determination of multiple parallel maximum output current

Based on the maximum output current of the single converter in combination with the current-sharing coefficient ($k_f$) for multiple converters connected in parallel, a final maximum output current is obtained as follows:

$$I_{Total} = i_d \times M \times N \times k_f \tag{18}$$

The present disclosure is described above in detail by means of specific embodiments and examples. However, the present disclosure is not limited thereto. A person skilled in the art can change and use different parameters of the thyristor and the converter system without departing from the principles of the present disclosure, or according to actual situations.

What is claimed is:

1. A method for calculating a maximum output current of multiple thyristor converters connected in parallel, comprising the following steps:
    step 1: setting an operating time (t) and determining a time for outputting a long pulse current according to an actual demand;
    step 2: assuming a trigger angle for a subsequent output current calculation;
    step 3: calculating a maximum output current of a single converter according to an output current model for the single converter;
    step 4: equally dividing a total output DC current into a plurality of parts according to a working duration of six converter bridge arms, thereby obtaining a pulse operating current of a single bridge arm;

step 5: checking whether a present junction temperature of a thyristor is below a limiting temperature using the pulse operating current obtained in step 4 based on a thermal resistance model for the thyristor, if no, correcting the trigger angle, and repeating step 2 to step 5 until the present junction temperature of the thyristor is below the limiting temperature;

step 6: giving a present trigger angle to provide guidance for actual experimental operations; and step 7: giving the maximum output current of multiple converters connected in parallel based on the maximum output current of the single converter in combination with a current-sharing coefficient for converters.

2. The method for calculating a maximum output current of multiple thyristor converters connected in parallel according to claim 1, comprising establishing an equivalent impedance model by using a multiple parallel-connected converter system to obtain a calculation formula for the maximum output current of multiple converters connected in parallel, wherein the model is established as follows:

the converter system is divided into an alternating current (AC) side and a direct current (DC) side; on the AC side, a grid side is connected to step-down transformers through high voltage buses, and the step-down transformers are connected to rectifier transformers that are connected to input ends of converters through AC buses; and on the DC side, output ends of the converters are connected to DC reactors for balancing current through DC buses and finally connected to a load; a number of step-down transformers is assumed as M, with each step-down transformer being connected with N converter branches, wherein both M and N are positive integers, each branch comprising the rectifier transformer, the AC bus, the converter, the DC reactor, the DC bus and the load; and since a plurality of branches are connected in parallel, currents of all branches are input together to the load by a DC busbar.

3. The method for calculating a maximum output current of multiple thyristor converters connected in parallel according to claim 2, comprising:

enabling parameters of the AC side to be equivalent to those of a secondary side of the rectifier transformer based on parameters of the converter system.

4. The method for calculating a maximum output current of multiple thyristor converters connected in parallel according to claim 1, comprising:

implementing a system impedance connection based on a relationship between an output voltage and an input voltage of a thyristor converter.

5. The method for calculating a maximum output current of multiple thyristor converters connected in parallel according to claim 1, comprising checking a maximum withstand current of a single converter by using the thermal resistance model for the thyristor, and multiplying the maximum withstand current by a number of the converters connected in parallel and the current-sharing coefficient to obtain an actual maximum output current of the multiple converters connected in parallel.

6. The method for calculating a maximum output current of multiple thyristor converters connected in parallel according to claim 1, comprising performing iteration to determine a trigger angle at a maximum withstand current of the single converter.

7. The method for calculating a maximum output current of multiple thyristor converters connected in parallel according to claim 1, wherein:

the limiting temperature is 125° C.

* * * * *